United States Patent [19]
Okamura et al.

[11] Patent Number: 4,894,629
[45] Date of Patent: * Jan. 16, 1990

[54] BANDPASS FILTER HAVING MAGNETICALLY COUPLED RESONATORS

[75] Inventors: Hisatake Okamura; Teruhisa Tsuru; Masahiko Kawaguchi, all of Nagaokakyo, Japan

[73] Assignee: Murata Manufacturing Co., Ltd., Kyoto, Japan

[*] Notice: The portion of the term of this patent subsequent to Jun. 28, 2005 has been disclaimed.

[21] Appl. No.: 21,051

[22] Filed: Mar. 2, 1987

[30] Foreign Application Priority Data

| Mar. 4, 1986 | [JP] | Japan | 61-46856 |
| Apr. 25, 1986 | [JP] | Japan | 61-97316 |
| Jan. 22, 1987 | [JP] | Japan | 62-12929 |
| Jan. 22, 1987 | [JP] | Japan | 62-12930 |

[51] Int. Cl.$^4$ .............................................. H03H 7/09
[52] U.S. Cl. ..................... 333/177; 333/185
[58] Field of Search ................ 333/185, 175–177, 333/167

[56] References Cited

U.S. PATENT DOCUMENTS

| 4,157,517 | 6/1979 | Kneisel et al. ........................ 333/205 |
| 4,203,081 | 5/1980 | Braeckelmann ................ 333/177 X |
| 4,451,804 | 5/1984 | Veisz et al. ..................... 333/175 X |
| 4,591,814 | 5/1986 | Ito et al. ................................ 333/177 |
| 4,601,062 | 7/1986 | Hettiger ........................... 333/176 X |
| 4,614,925 | 9/1986 | Kane .................................. 333/185 X |
| 4,754,242 | 6/1988 | Okamura et al. ............... 333/177 X |

FOREIGN PATENT DOCUMENTS

| 1804862 | 5/1970 | Fed. Rep. of Germany ...... 333/185 |
| 4871319 | 9/1978 | Japan . |
| 136126 | 8/1983 | Japan ................................. 333/185 |
| 182309 | 8/1986 | Japan ................................. 333/177 |
| 7408096 | 12/1974 | Netherlands ........................ 333/185 |

Primary Examiner—Eugene R. LaRoche
Assistant Examiner—Benny T. Lee
Attorney, Agent, or Firm—Armstrong, Nikaido, Marmelstein, Kubovcik & Murray

[57] ABSTRACT

A bandpass filter comprising a plurality of resonators coupled by a magnetic induction coupling. Each of the resonators includes an equivalent circuit having an LC series circuit and a capacitance element connected in parallel, the LC series circuit including one capacitance element and two inductance elements connected in series to both sides of the one capacitance element. This construction realizes the magnetic induction coupling by utilizing the inductance elements constituting the resonators, without necessitating a separate coupling means such as a capacitance element.

15 Claims, 23 Drawing Sheets

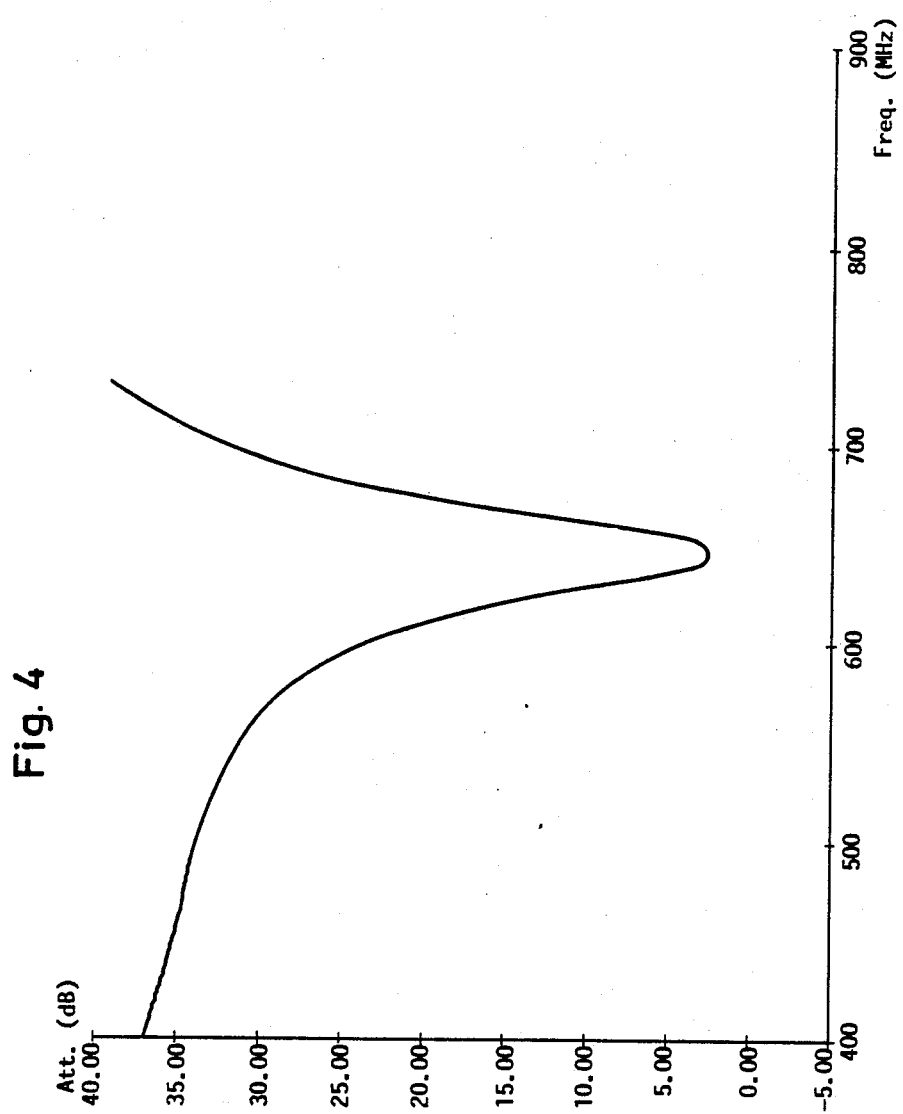

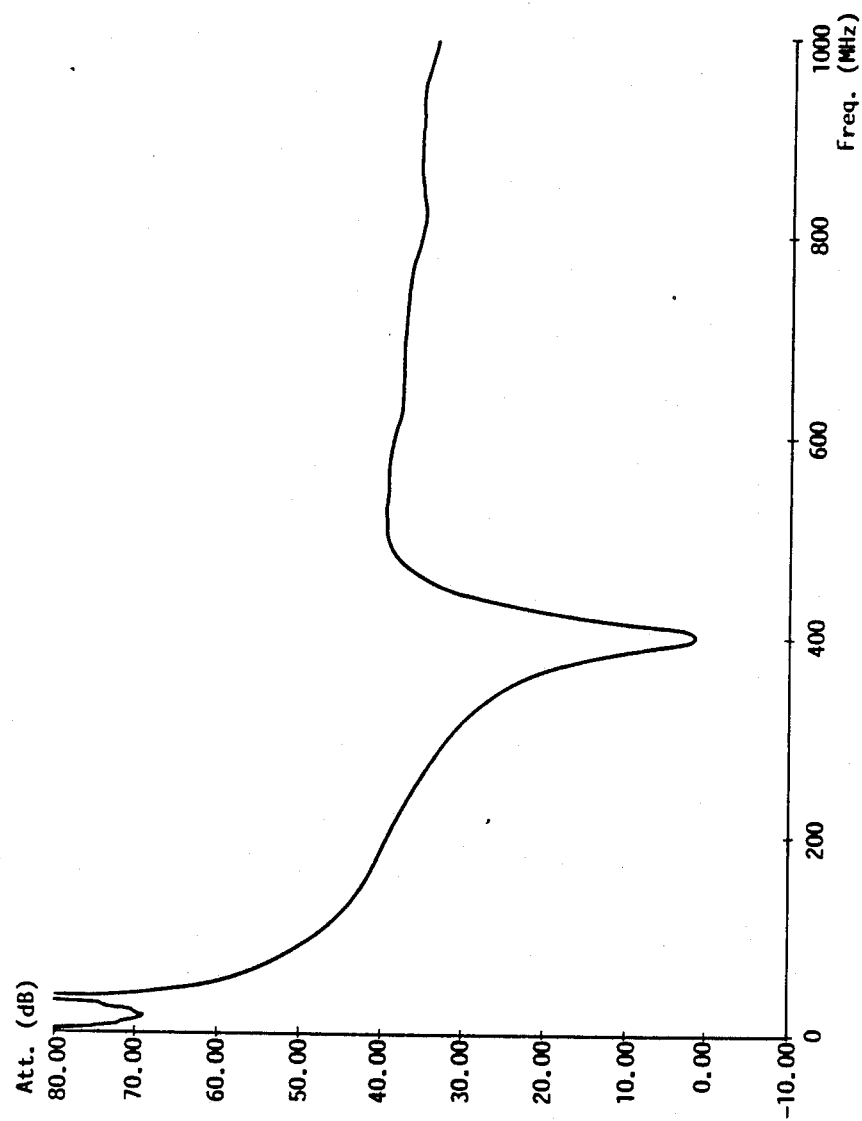

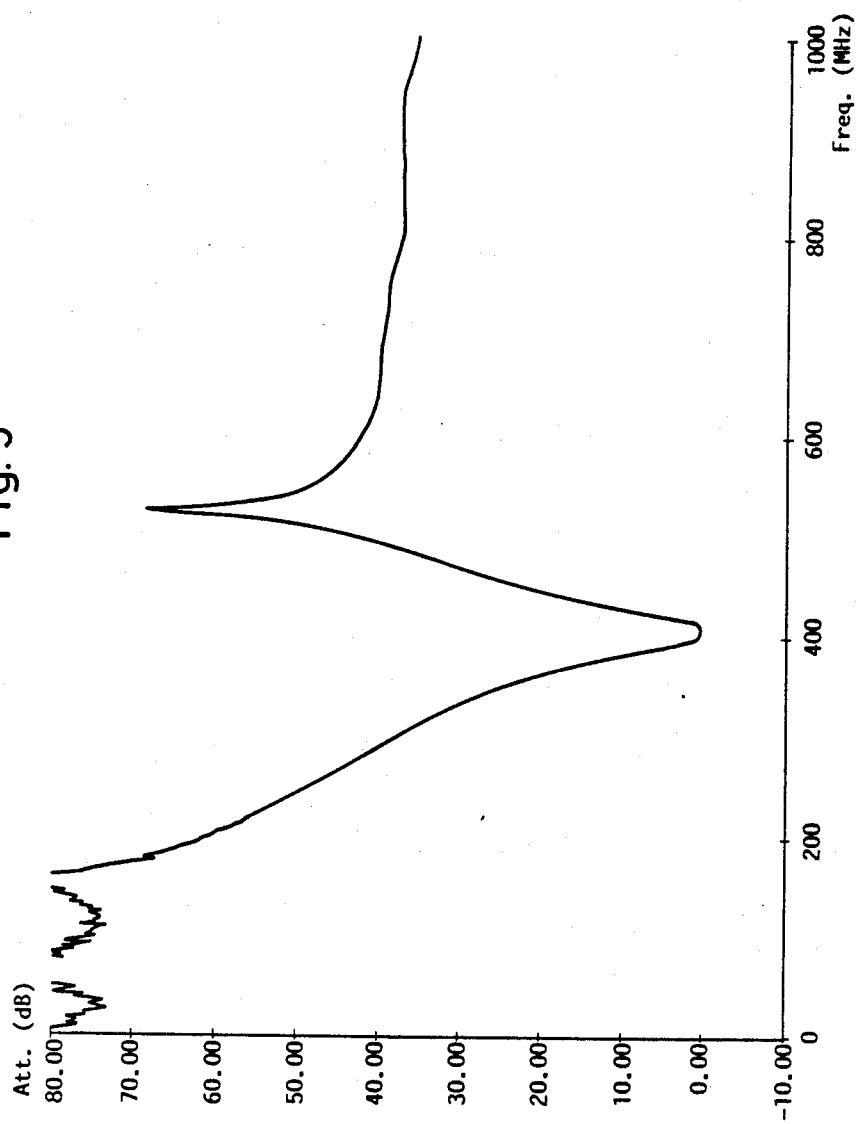

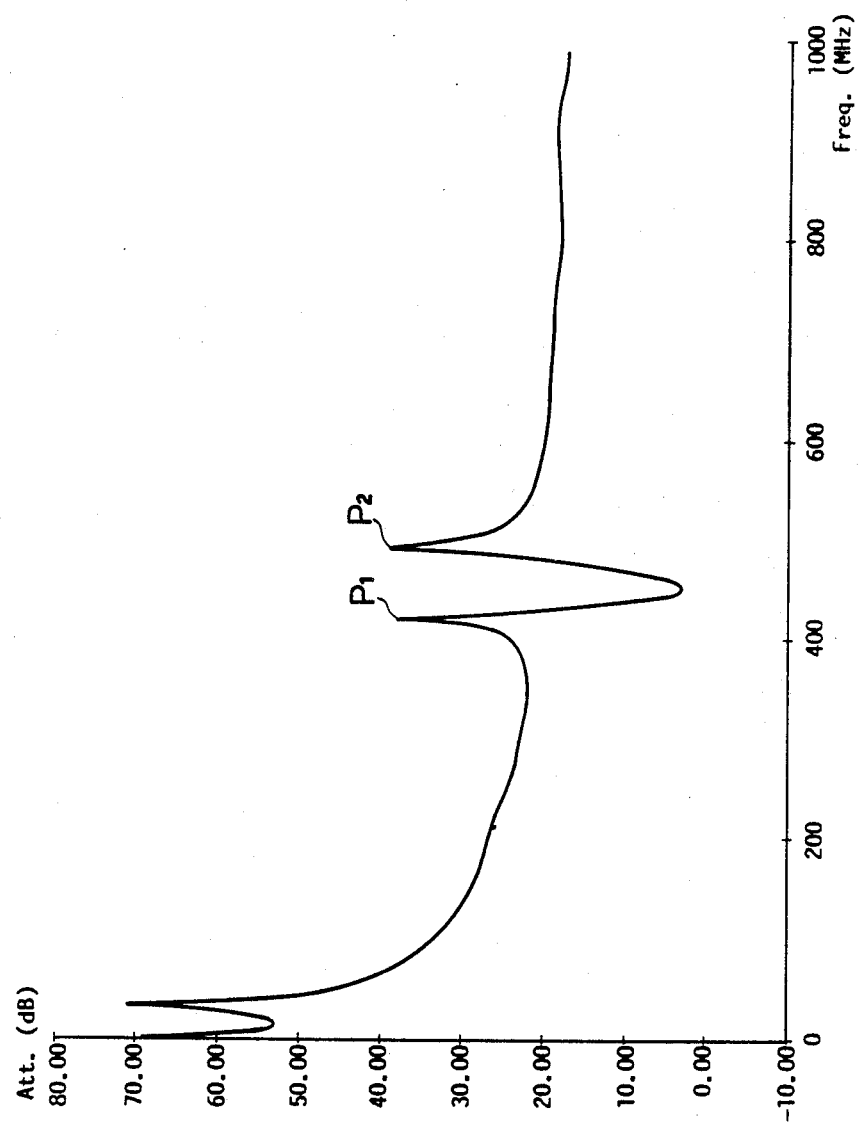

BANDPASS FILTER HAVING MAGNETICALLY COUPLED RESONATORS

BACKGROUND OF THE INVENTION

(1) Field of the Invention

The present invention relates to a bandpass filter, and more particularly to a bandpass filter suitable for use in a frequency range including and above the UHF band.

(2) Description of the Prior Art

A bandpass filter for use in the frequency range noted above is required to have a very high degree of Q factor for its filter characteristics. Existing filters include a stripline filter as disclosed in U.S. Pat. No. 4,157,517, and filters as disclosed in Japanese Utility Model Publication No. 53-40121 and Utility Model Laying-Open Publication No. 56-78572 wherein conducting layers are formed on a substrate.

In the case of the stripline filter, an electrode must be formed over an entire back face area of the substrate. This necessitates a large amount of electrode material, which results in high cost of the filter. In the case of the filter having conducting layers formed on the substrate, a plurality of resonators each including one inductance element and one capacitance element connected in parallel are coupled to one another by coupling means such as capacitance elements. Such a construction requires the coupling elements in addition to the resonators, and therefore is large in size and troublesome to assemble.

SUMMARY OF THE INVENTION

Accordingly, a primary object of the present invention is to provide a bandpass filter which is the type of filter including resonators coupled to each other in a plural step mode, not the stripline type filter, and which permits the resonators to be coupled to each other without necessitating separate coupling members.

Another object of the invention is to provide a compact bandpass filter that may be formed on a single substrate.

In order to achieve the above and other objects, a preferred embodiment of the present invention comprises a plurality of resonators each including an LC series circuit having one capacitance element and two inductance elements connected in series to both sides of the capacitance element, and a further capacitance element connected parallel to the LC series circuit. The inductance element in each resonator is disposed close to the inductance element in an adjacent resonator, whereby a magnetic induction coupling is established between the resonators.

BRIEF DESCRIPTION OF THE DRAWINGS

These and other objects, advantages and features of the invention will become apparent from the following description thereof taken in conjunction with the accompanying drawings, in which:

FIG. 4 is a view showing frequency characteristics of the filter,

FIG. 6 is a view showing frequency characteristics of the bandpass filter of FIGS. 5A to 5C, FIG. 9 is a view showing frequency characteristics of the filter shown in FIG. 7, FIG. 19 is a view showing frequency characteristics of the filter shown in FIGS. 17A-17C.

DESCRIPTION OF THE PREFERRED EMBODIMENTS

Figure 1A:
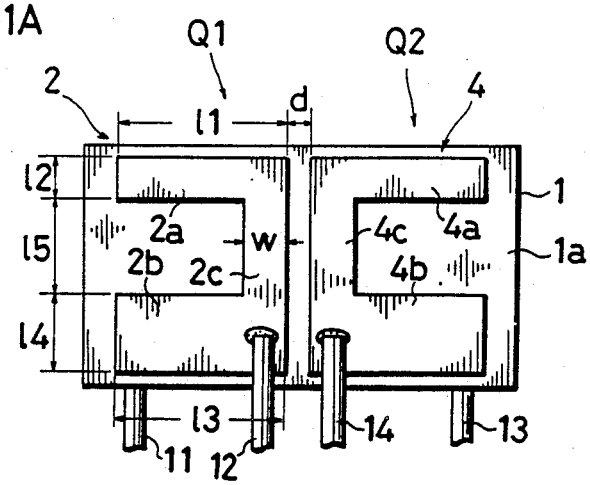
FIG. 1A is a front view of a bandpass filter according to one embodiment of the invention.
Figure 1B:
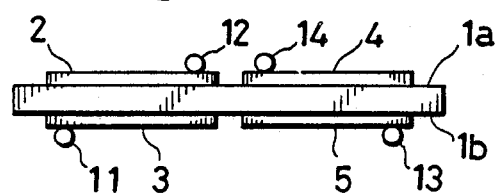
FIG. 1B is a bottom view of the bandpass filter.
Figure 1C:
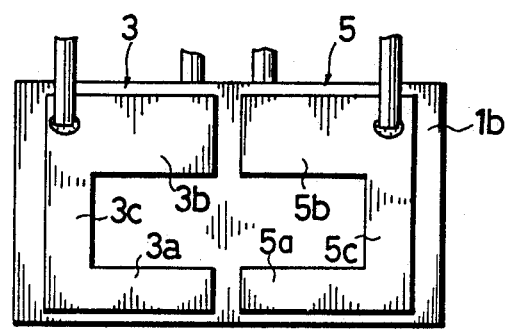
FIG. 1C is a rear view of the bandpass filter.

FIGS. 1A through 1C show a bandpass filter according to one embodiment of the present invention. This bandpass filter comprises a dielectric substrate 1 of a ceramic material for example, and U-shaped conducting layers 2, 3, 4 and 5 formed hereon by screen printing silver paste. The conducting layers 2 and 4 are formed on a front face 1a of the substrate 1 while the conducting layers 3 and 5 are formed on a back face 1b thereof. Each of the conducting layers 2–5 comprises two capacitor electrode portions 2a and 2b, 3a and 3b, 4a and 4b, or 5a and 5b, and one coil portion 2c, 3c, 4c, or 5c. The capacitor electrode portions 2a, 2b, 4a and 4b on the front face 1a are opposed across the substrate 1 to the capacitor electrode portions 3a, 3b, 5a and 5b on the back face 1b, respectively, to constitute capacitance elements having capacities determined by the permittivity and thickness of the substrate 1 and by the areas over which the capacitor electrode portions are opposed. On the other hand, the coil portions 2c, 3c, 4c and 5c are not in mutually opposed positions. The coil portions 2c, 3c, 4c and 5c constitute inductance elements in high frequency. Numbers 11 and 13 in FIGS. 1 denote input and output lead terminals, and numbers 12 and 14 denote grounding terminals.

Figure 2:
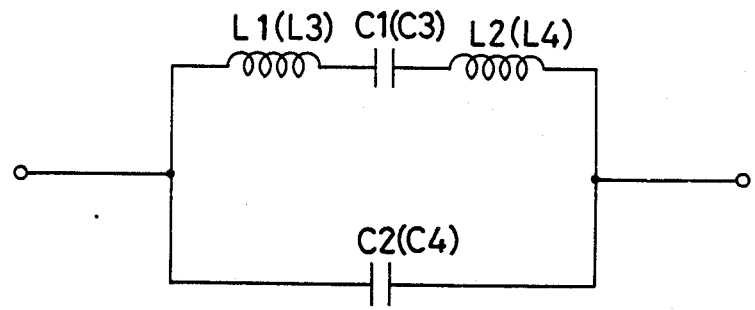
FIG. 2 is a view of an equivalent circuit of a resonator constituting the bandpass filter of FIG. 1.
Figure 3:
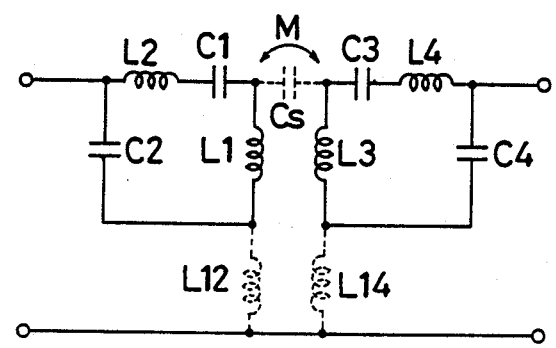
FIG. 3 is a view of an equivalent circuit of the bandpass filter of FIG. 1.

The conducting layers 2 and 3 and the conducting layers 4 and 5 opposed to each other across the dielectric substrate 1, respectively, constitute resonators Q1 and Q2 each represented by an equivalent circuit as shown in FIG. 2. The equivalent circuit includes an LC series circuit having a first capacitance element C1 (or C3) and inductance elements L1 and L2 (or L3 and L4) connected in series to both sides of the first capacitance element C1 (or C3), and a second capacitance element C2 (or C4) connected parallel to the LC series circuit. Since the two coil portions 2c and 4c have a narrow spacing d therebetween as shown in FIG. 1A, a magnetic induction coupling is established between the two coil portions 2c and 4c. Thus, the resonators Q1 and Q2 having the above equivalent circuit constitute a bandpass filter represented by an equivalent circuit as shown in FIG. 3. Reference M in FIG. 3 denotes a mutual inductance representing the magnetic induction coupling between the two coil portions 2c and 4c. References L12 and L14 denote inductance of lead wires 12 and 14. It will be noted that, because the dielectric substrate 1 is utilized, not only the magnetic coupling but a capacity coupling occurs between the two resonators Q1 and Q2. Reference Cs schematically denotes the coupling capacity. The degree of coupling (including both the magnetic coupling and the capacity coupling) is variable by changing the spacing d between the two coil portions 2c and 4c, thereby to enable adjustment of the passband width of the bandpass filter.

It is to be understood that the passband width is increased by reducing the the spacing d, and is decreased by enlarging the spacing d.

FIG. 4 shows frequency characteristics of the bandpass filter having the described construction. It will be seen that the bandpass filter has very steep characteristics wherein the center frequency is at 644 MHZ with a 20 MHZ and width. In order to realize such frequency characteristics, the substrate 1 and conducting layers 2–5 have the following dimensions and other specifications:

(A) Dielectric Substrate: 0.4 mm thick, 14 mm long, 9 mm wide, and permittivity 80.
(B) Conducting Layers (All layers have the same dimensions): l1=7 mm, l2=1.5 mm, l3=7 mm, l4=3.5 mm, l5=6 mm, C1=11 PF, C2=53 PF, and L1=L2 =2.77 nH.

(C) Spacing d between Coil Portions 2c and 4c: 1 mm. The width W of each coil portion is not related to the inductance value. However, the greater the width, the smaller is the resistance and the higher becomes the value of Q factor which is desirable. In this embodiment, the width W=1.5 mm.

Figure 5A:
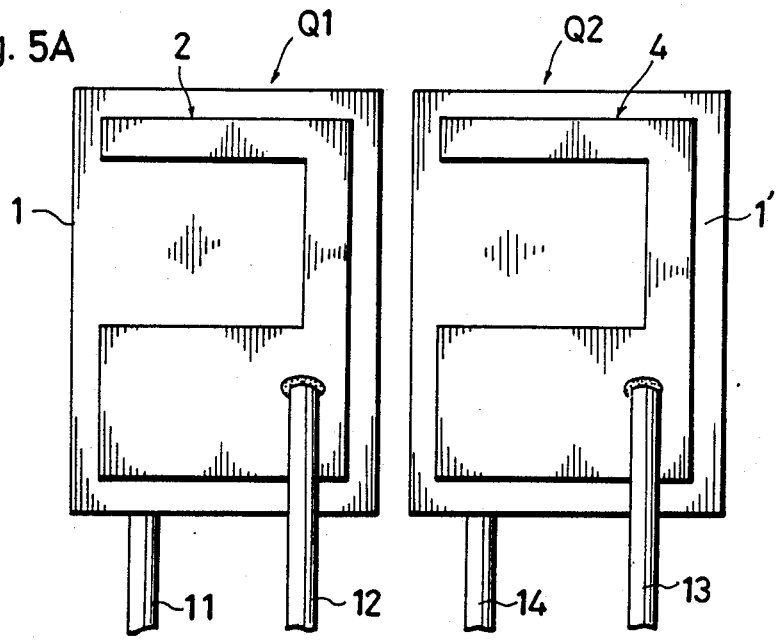
FIG. 5A is a front view of a bandpass filter according to another embodiment of the invention.
Figure 5B:
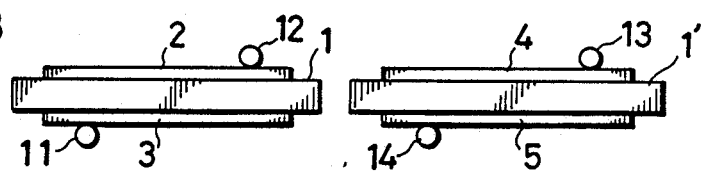
FIG. 5B is a bottom view of the bandpass filter shown in FIG. 5A.
Figure 5C:
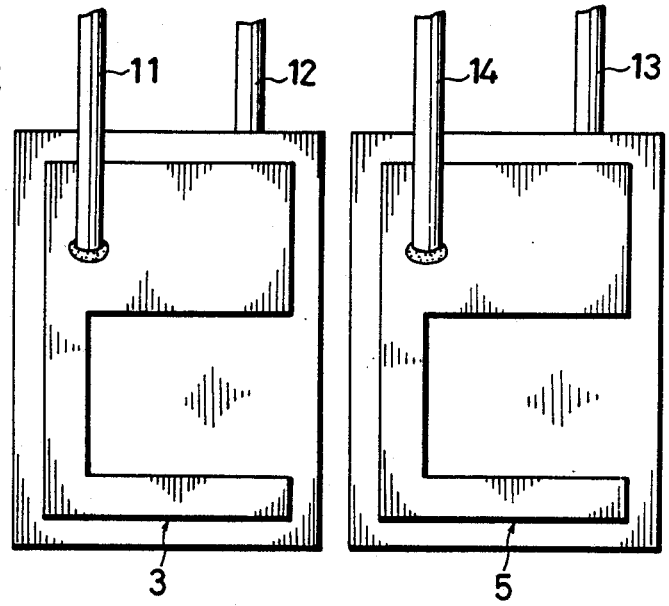
FIG. 5C is a rear view of the bandpass filter shown in FIG. 5A.

FIG. 5A through 5C show another embodiment of the present invention. While in the preceding embodiment the two resonators Q1 and Q2 are formed on a single dielectric substrate, in the second embodiment the resonators are formed on separate dielectric substrates. Accordingly, the two resonators Q1 and Q2 are coupled by placing the two dielectric substrates 1 and 1' in the illustrated relative positions. Since the substrates 1 and 1' are interposed by a layer of air, the capacity coupling is reduced and the resonators are coupled to each other mainly by the magnetic coupling.

The filter according to this embodiment has frequency characteristics as shown in FIG. 6 which have the center frequency near 400 MHz in contrast with the case of the frequency characteristics of the preceding embodiment shown in FIG. 4. The center frequency may be set as desired by varying the thickness and permittivity of the dielectric substrates and the shapes of the conducting layers.

Figure 7:
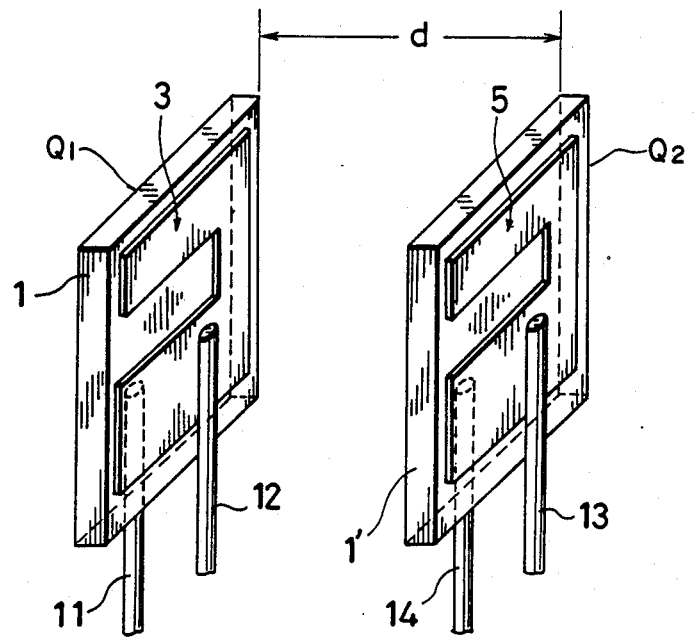
FIG. 7 is a perspective view of a bandpass filter according to a further embodiment of the invention.
Figure 8:
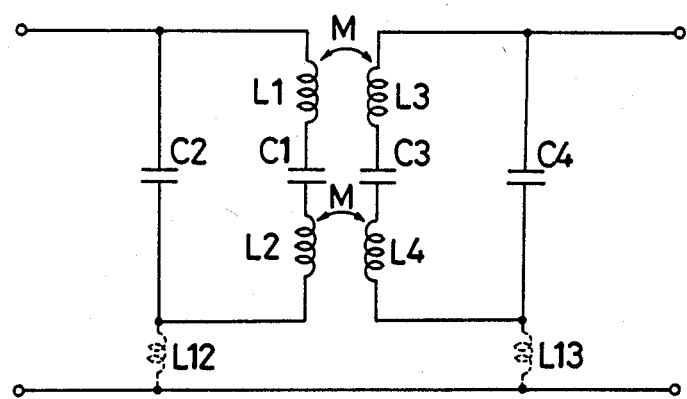
FIG. 8 is a view of an equivalent circuit of the filter shown in FIG. 7.

FIG. 7 shows a further embodiment of the present invention. In this embodiment, the resonators Q1 and Q2 are formed on separate dielectric substrates 1 and 1' placed in a mutually opposing relationship. Since a magnetic induction coupling is established between the coil portions of the conducting layers on the opposite substrates 1 and 1', this construction constitutes a bandpass filter having an equivalent circuit as shown in FIG. 8. In this embodiment too, the band width is adjustable by varying a distance d between the two dielectric substrates 1 and 1'. An example of frequency characteristics of this embodiment is shown in FIG. 9 which has a center frequency near 400 MHz and a spike near 500 MHz and where the disturbances at the left most position represents noise of the measuring apparatus.

The foregoing embodiments invariably comprise the resonators having the equivalent circuit of FIG. 2 coupled in a two step mode. However, the present invention is not limited to the two step coupling mode. The resonators may be coupled in three or more steps.

Figure 10A:
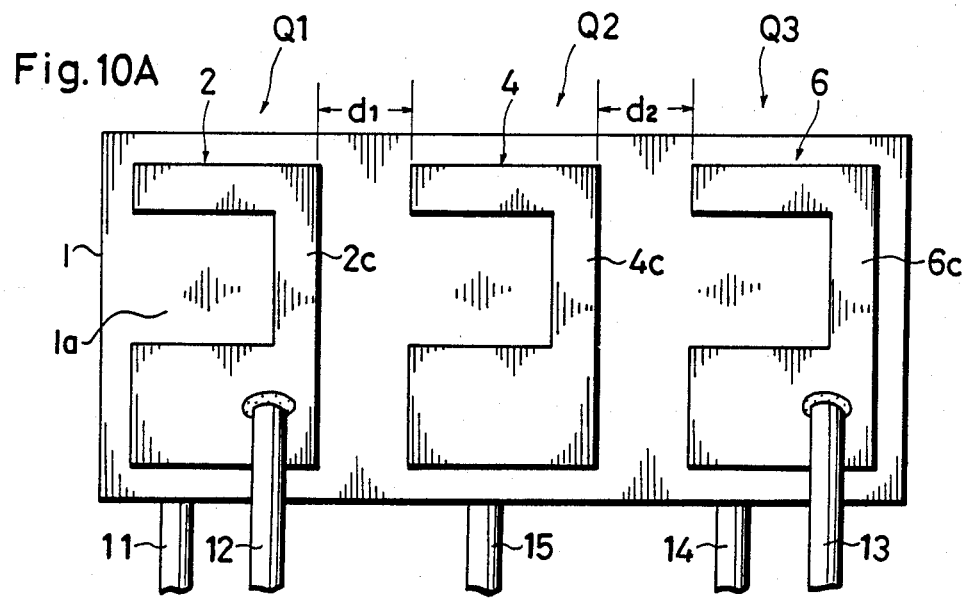
FIG. 10A is a front view of a filter according to a further embodiment of the invention.
Figure 10B:
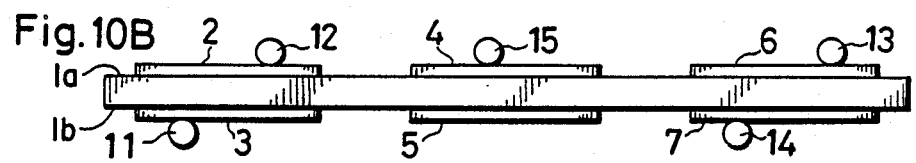
FIG. 10B is a bottom view of the filter shown in FIG. 10A.
Figure 10C:
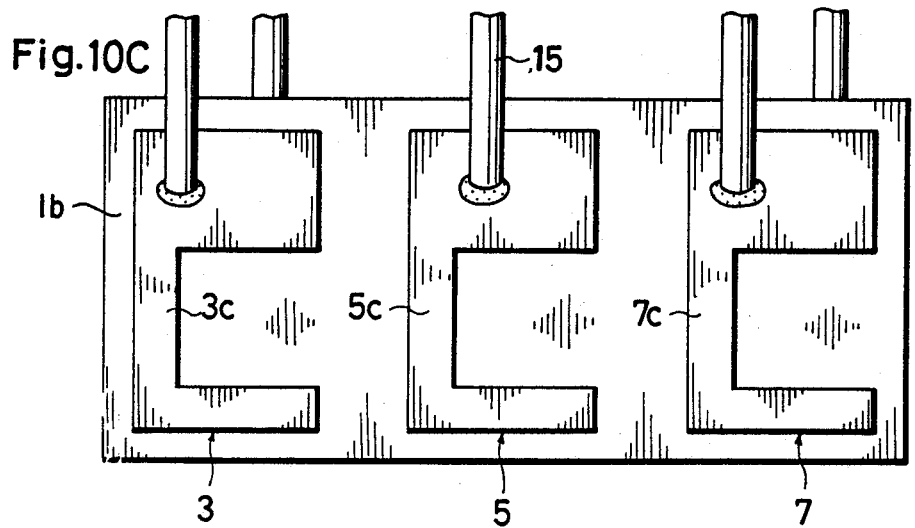
FIG. 10C is a rear view of the filter shown in FIG. 10A.

FIGS. 10A through 10C illustrate a three step coupling mode as one example. In this embodiment, a single dielectric substrate 1 has a front face 1a and a back face 1b each carrying three conducting layers 2, 4 and 6, or 3, 5 and 7 arranged with spacings d1 and d2 therebetween and d2 therebetween where 6, and 7 correspond to a U-shaped conduction layer formed on the front and back face of substrate 1 opposed to conductive layers 2, 4 and 3, 5 respectively and d2 corresponds to the spacing between layers 4 and 6. This construction provides a bandpass filter including three resonators Q1, Q2 and Q3 having the same circuit as shown in FIG. 2 and connected to each other by the magnetic induction coupling. The layers 6 and 7 have the same shape as the layers 2–5 in the preceding embodiments. Number 15 in FIGS. 10 denotes a lead terminal for grounding a part of the intermediate resonator Q2.

Figure 11:
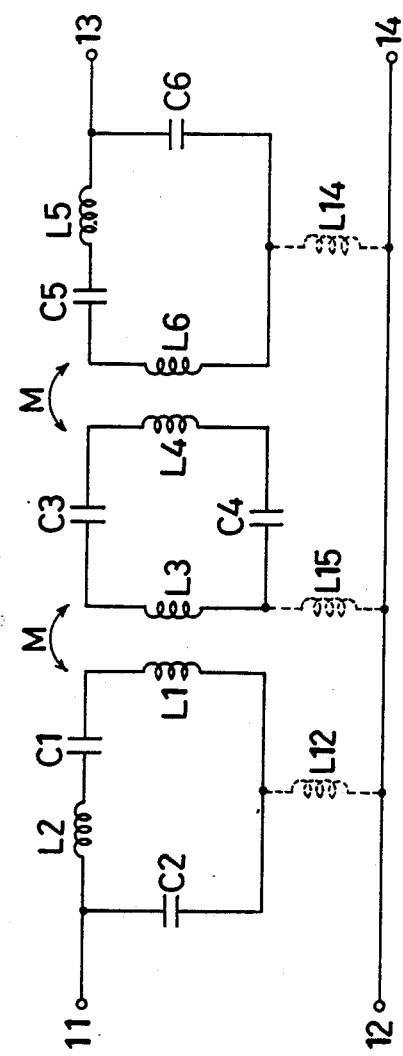
FIG. 11 is a view of an equivalent circuit of the filter shown in FIGS. 10A-10C.
Figure 12:
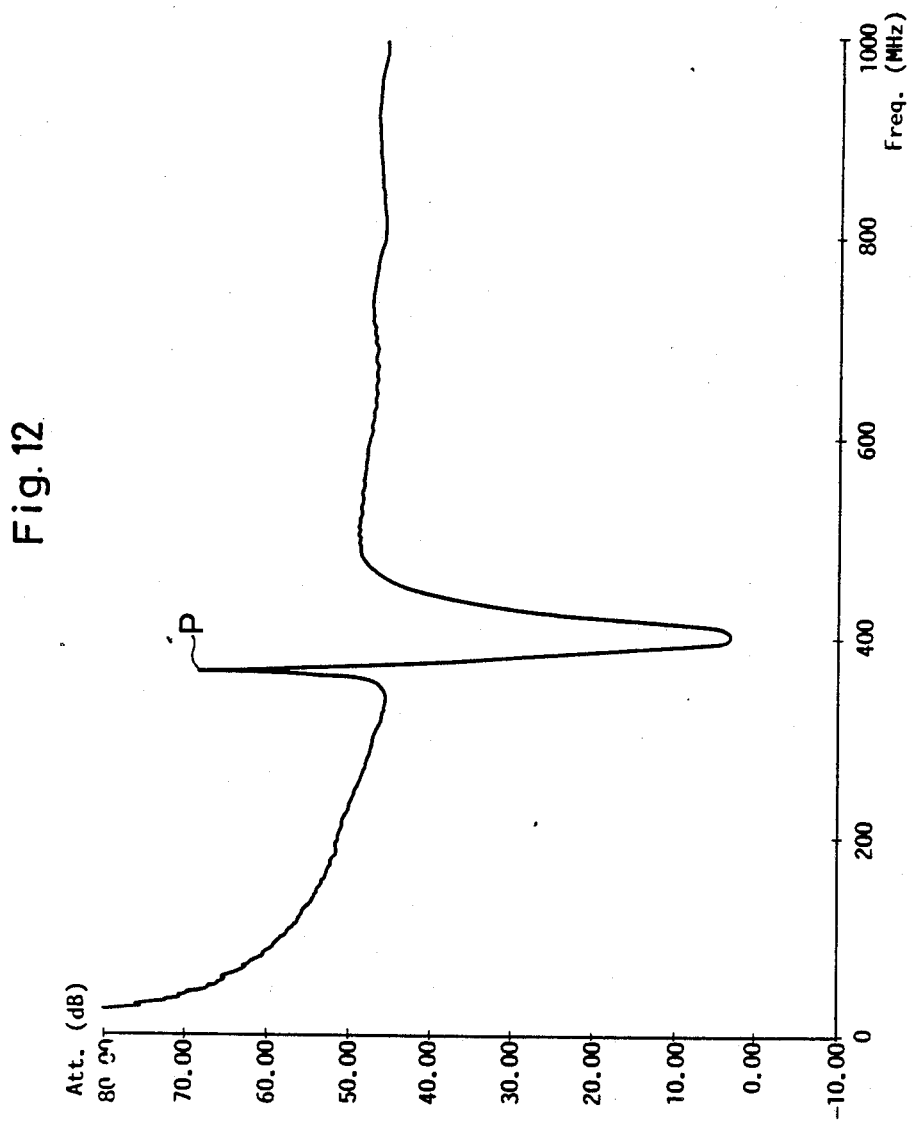
FIG. 12 is a view showing frequency characteristics of the filter shown in FIGS. 10A-10C.

The bandpass filter according to this embodiment has an equivalent circuit as shown in FIG. 11 which is similar to FIG. 3 but include components inductive and capacitive L6, C6, C5 and L5 and frequency characteristics as shown in FIG. 12. References L12, L14 and L15 denote coil components of lead terminals 12, 14 and 15, respectively. It will be seen from FIG. 12 that a pole P occurs at one side of the passband width in the case of the bandpass filter having the resonators connected in a three step mode.

Figure 13:
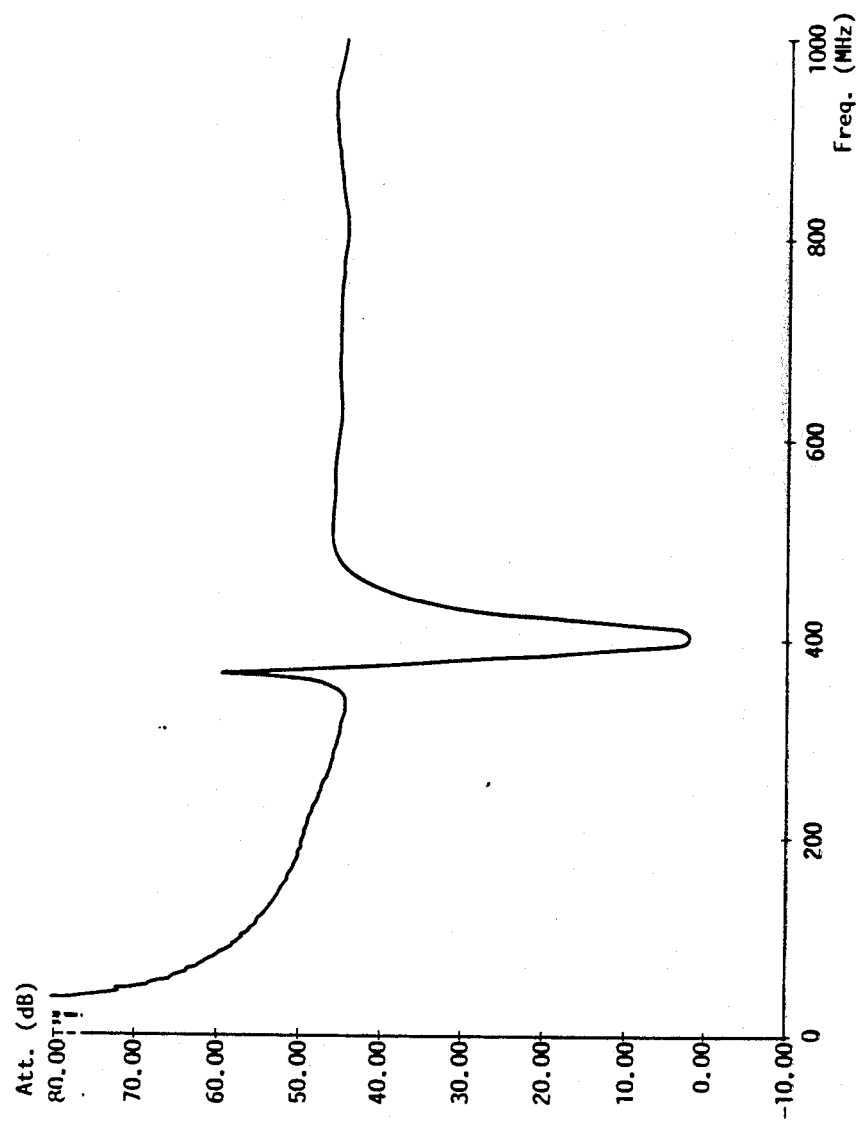
FIG. 13 is a view showing frequency characteristics of a filter according to a further embodiment of the invention.

With the embodiment shown in FIG. 10, the lead terminal 15 connected to the intermediate resonator Q2 may be dispensed with. Then the intermediate resonator Q2 is ungrounded in the equivalent circuit. This results in frequency characteristics as shown in FIG. 13 which are slightly different from the frequency characteristics of FIG. 12.

Figure 14:
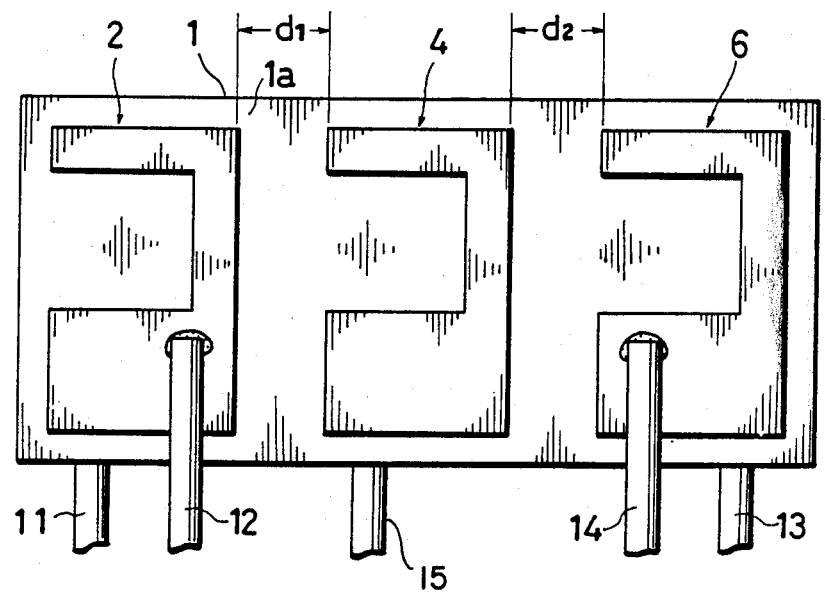
FIG. 14 is a front view of a filter according to a further embodiment of the invention.
Figure 15:
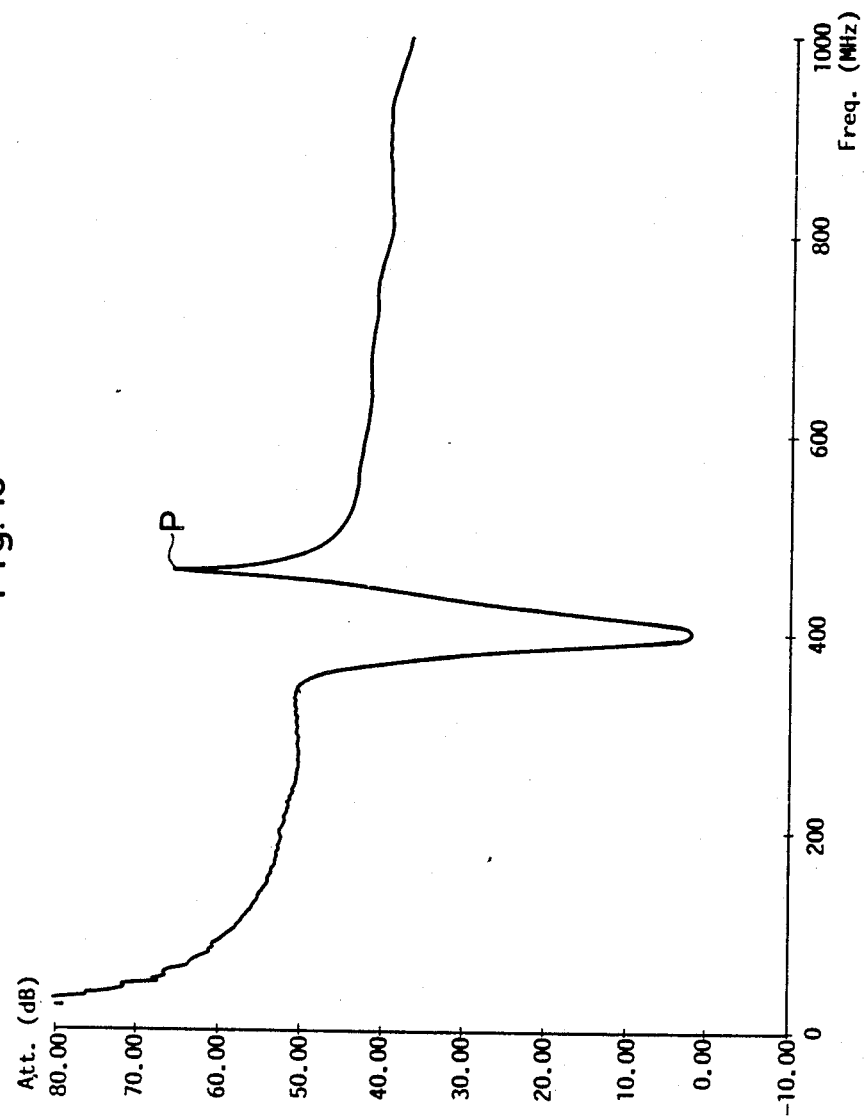
FIG. 15 is a view showing frequency characteristics of the filter shown in FIG. 14.

On the other hand, the lead terminals 13 and 14 of the third resonator Q3 may be changed in their connections as shown in FIG. 14 which are opposite to the connections shown in FIG. 10, with the lead terminal 15 retained in position. Then, the filter has frequency characteristics as shown in FIG. 15 wherein the position of pole P is opposite across the passband range to the position of pole P shown in FIG. 12. As in the case of the filter having resonators connected in two steps, the passband width of the filter having the resonators connected in three steps is adjustable to be wider or narrower by varying the spacings d1 and d2.

Figure 16:
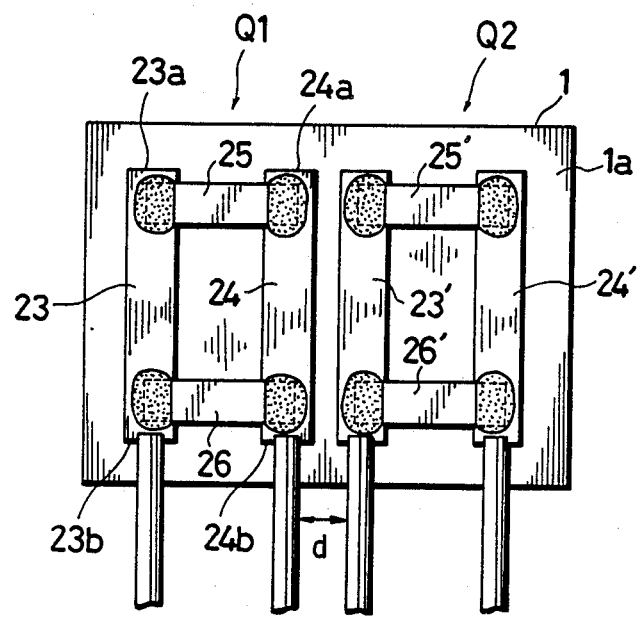
FIG. 16 is a front view of a filter according to a further embodiment of the invention.

FIG. 16 shows a still further embodiment of the present invention. In this embodiment, a substrate 1 carries two parallel coil layers 23 and 24 formed on a front face 1a thereof. The coil layers 23 and 24 are interconnected at opposite ends 23a, 24a, 23b and 24b such as by soldering chip capacitors 25 and 26 thereto. This construction provides a resonator Q1 having the equivalent circuit shown in FIG. 2. A similar resonator Q2 (having identical components marked with a reference number having apostrophes) is provided on the same substrate next to the resonator Q1, whereby a magnetic induction coupling is established between the two resonators.

This construction provides a filter having an equivalent circuit similar to that of the first embodiment. The substrate 1 of this embodiment may comprise a ferrite substrate instead of the dielectric substrate. Since ferrite has a great permeability, an inductance value necessary to the resonators may be secured even if the coil layers are short, which permits the entire construction to be reduced in size.

As in the case of the preceding embodiments, the passband width of this embodiment may be adjusted to be wider or narrower by varying spacing d.

Figure 17A:
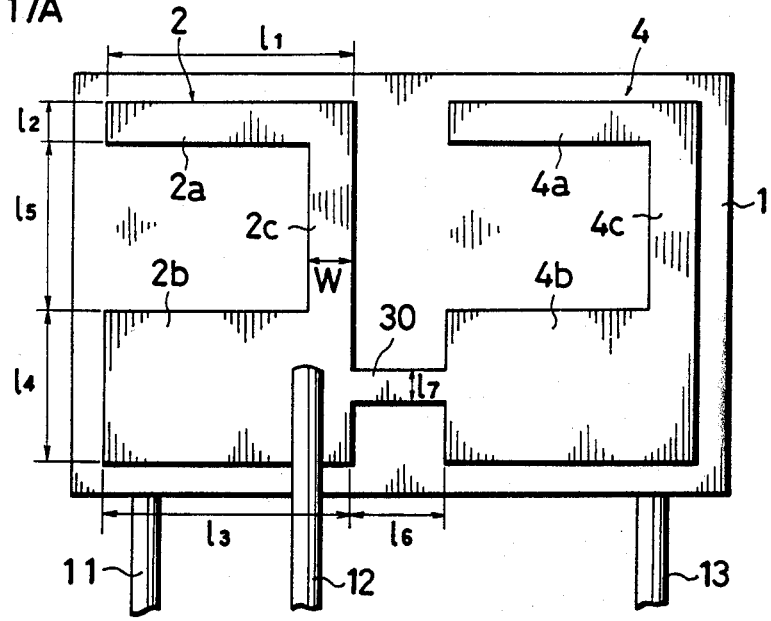
FIG. 17A is a front view of a bandpass filter according to a further embodiment of the invention.
Figure 17B:
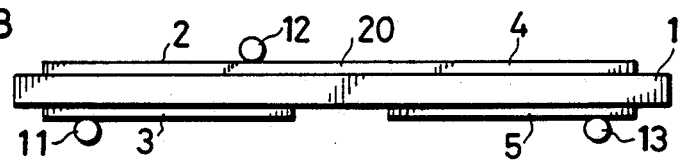
FIG. 17B is a bottom view of the filter shown in FIG. 17A.
Figure 17C:
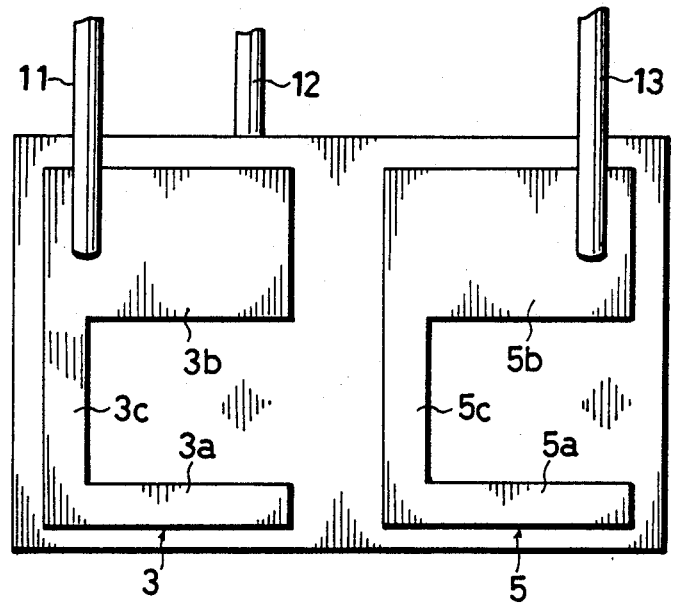
FIG. 17C is a rear view of the filter shown in FIG. 17A.
Figure 18:
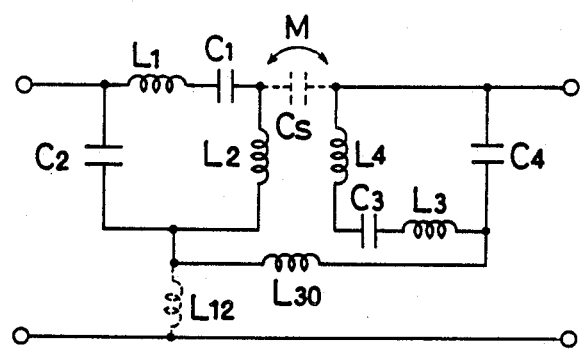
FIG. 18 is a view of an equivalent circuit of the filter shown in FIGS. 17A-17C.

In each of the above embodiments, the resonators are coupled by the magnetic induction coupling between the coil portions or layers constituting the resonator. In addition thereto, the resonators may be coupled to one another by forming at least portions of the resonators with elements such as metal pieces that constitute an equivalent of the coils or with elements such as capacitors having leads that constitute an equivalent of the series circuit including the coils and capacitors. This creates poles in the filter characteristics and provides steeper filter characteristics. FIGS. 17A through 17C illustrate a construction wherein two resonators are coupled by a conducting coil layer portion 30 in addition to the magnetic induction coupling between coil portions. This construction has an equivalent circuit as shown in FIG. 18. Reference L30 in FIG. 18 denotes the inductance of the conducting coil layer portion 30. The other elements are affixed with the same references or numerals as in the equivalent circuit of the first embodiment shown in FIG. 2. FIG. 19 shows frequency characteristics of the bandpass filter having the above construction. It will be seen that poles P1 and P2 are formed at opposite sides of the center frequency by providing coupling coil L30, and that the illustrated characteristics are steeper than those shown in FIG. 4, the latter resulting from the construction without coupling coil L30. The characteristics shown in FIG. 19 reflect actual measurements where the capacitor electrode portions, coil portions 2a-5b, and coupling coil portion 30 have the following dimensions:

(A) Dielectric Substrate: 0.4 mm thick, 14 mm long, 9 mm wide, and dielectric constant 80.
(B) Conducting Layers (All layers have the same dimensions): l1=7 mm, l2=1.5 mm, l3=6 mm, l4=3.5 mm, l5=7 mm, l6=3.5 mm, l7=1.1 mm, C1=11 PF, C2=53 PF, L1=L2=2.77 nH, and L5=2 nH.

Figure 20A:
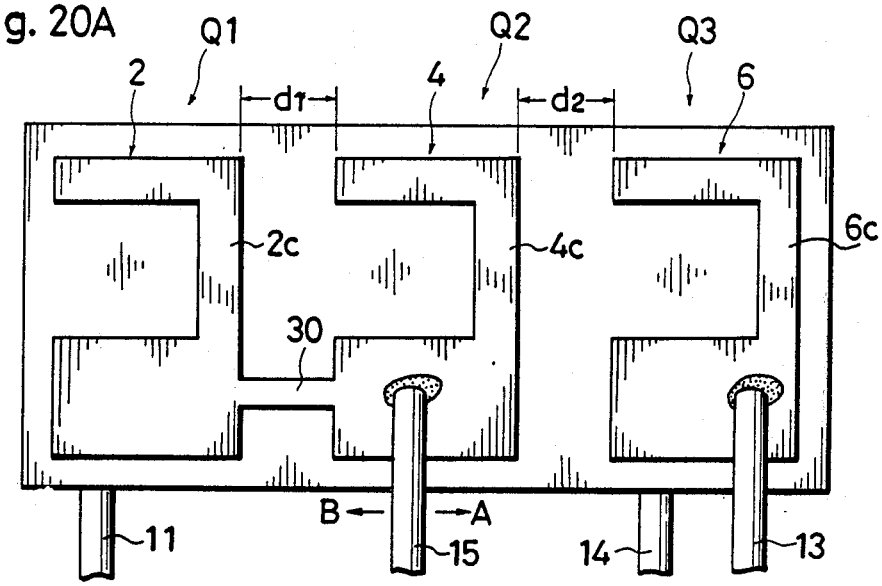
FIG. 20A is a front view of a bandpass filter according to a further embodiment of the invention.
Figure 20B:
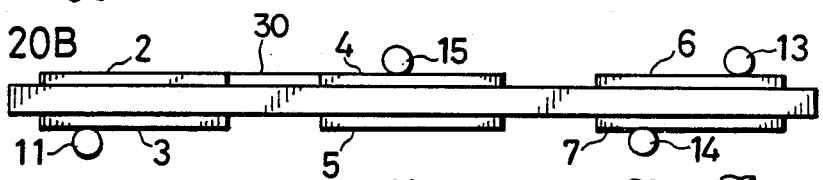
FIG. 20B is a bottom view of the filter shown in FIG. 20A.
Figure 20C:
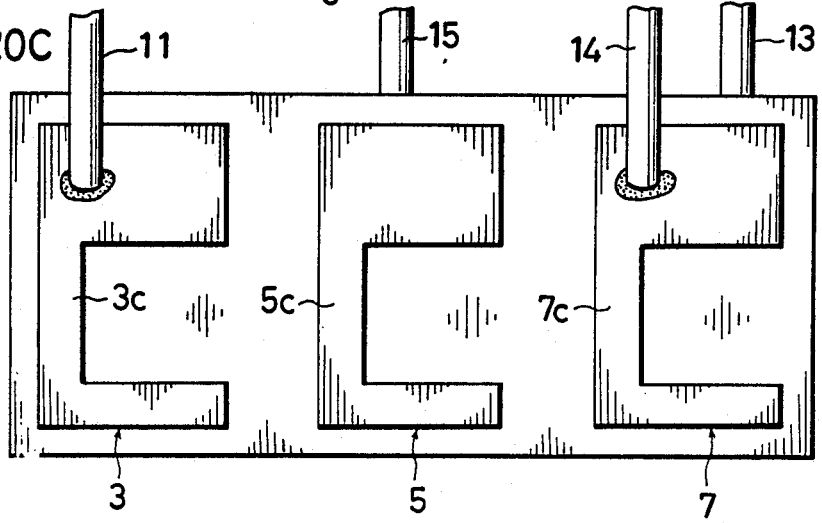
FIG. 20C is a rear view of the filter shown in FIG. 20A.
Figure 21:
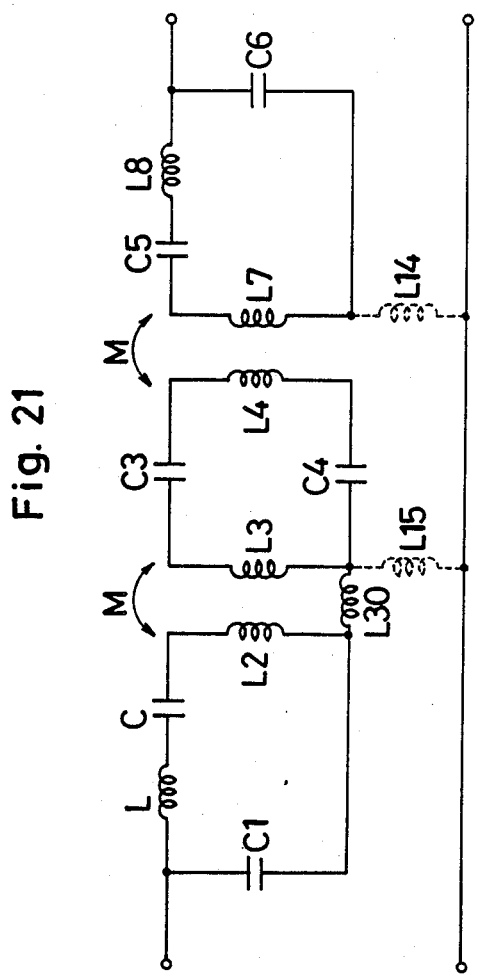
FIG. 21 is a view of an equivalent circuit of the filter shown in FIGS. 20A-20C.

FIGS. 20A through 20C illustrate a bandpass filter including resonators coupled in three steps, wherein two of the resonators are interconnected by a conducting coil layer portion 30. This filter has an equivalent circuit as shown in FIG. 21 (where components inductive and capacitive C5, C6, L7, L8 are shown) and frequency characteristics as shown in FIG. 22.

Figure 22:
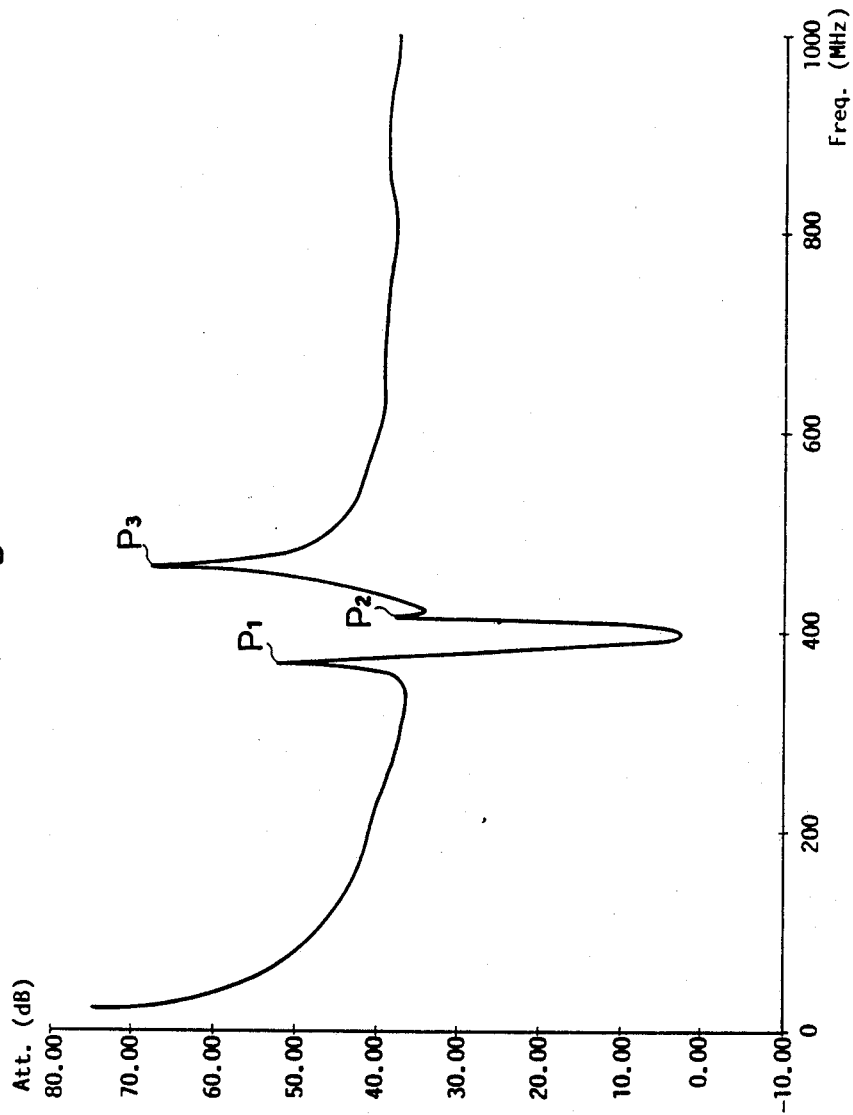
FIG. 22 is a view showing frequency characteristics of the filter shown in FIGS. 20A-20C.

It will be seen from FIG. 22 that the bandpass filter according to this embodiment has sharp rising characteristics with poles P1 and P2 formed adjacent opposite sides of the center frequency. At the same time, a pole P3 is formed in a high frequency region with respect to the pole P2, but this pole P3 does not affect the sharp rising characteristics.

The frequencies at poles P1 and P2 may be moved toward and away from the center frequency by shifting the connection of a lead terminal 15 to an intermediate resonator Q2 in directions indicated by arrows A and B in FIG. 20A.

Figure 23A:
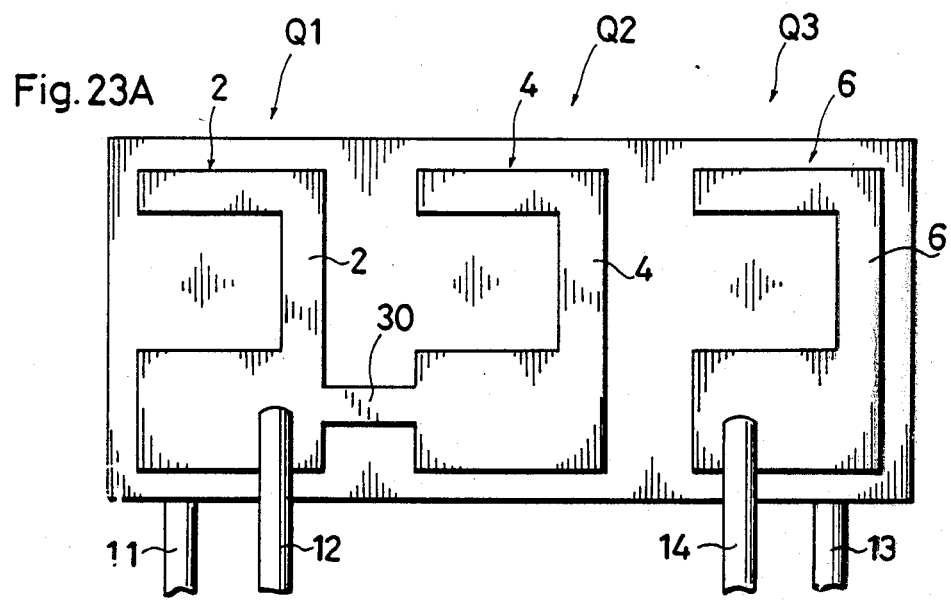
FIG. 23A is a front view of a bandpass filter according to a further embodiment of the invention.
Figure 23B:
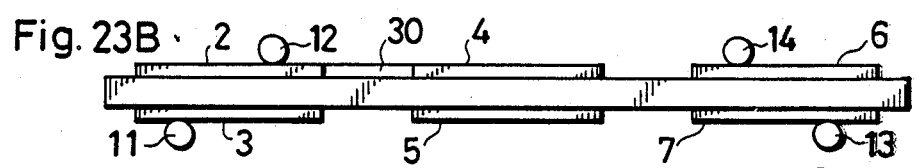
FIG. 23B is a bottom view of the filter shown in FIG. 23A.
Figure 23C:
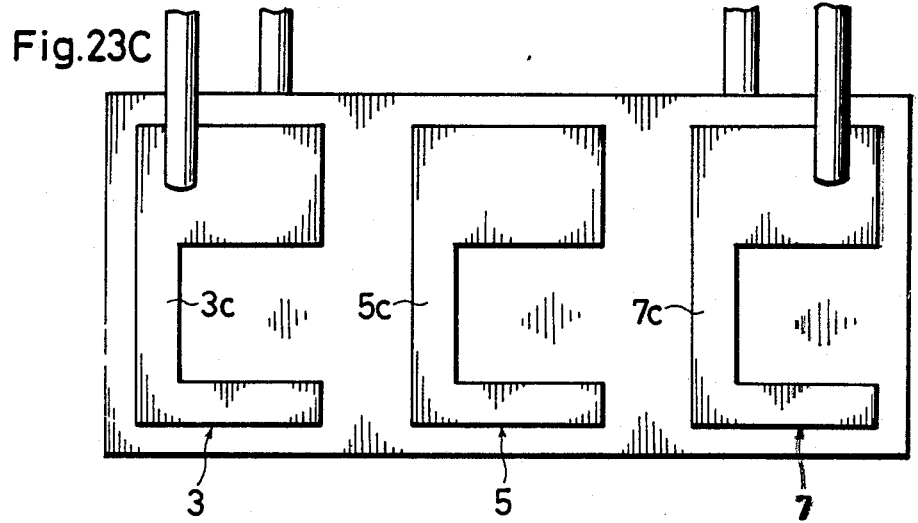
FIG. 23C is a rear view of the filter shown in FIG. 23A.
Figure 24:
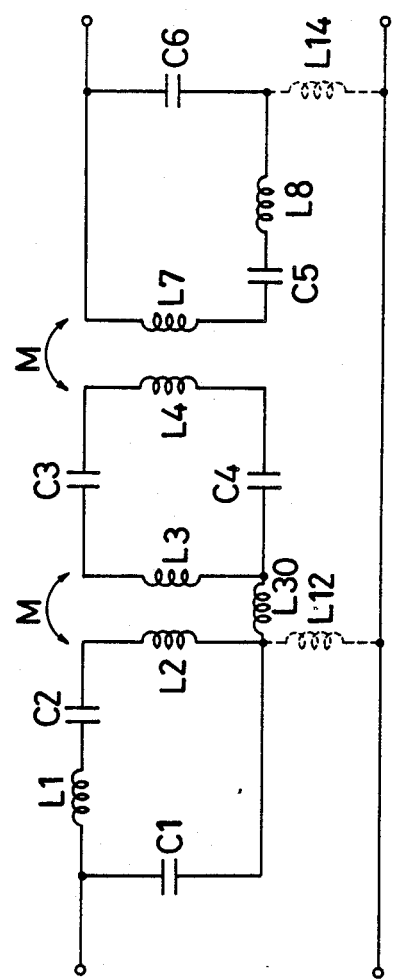
FIG. 24 is a view of an equivalent circuit of the filter shown in FIGS. 23A-23C.
Figure 25:
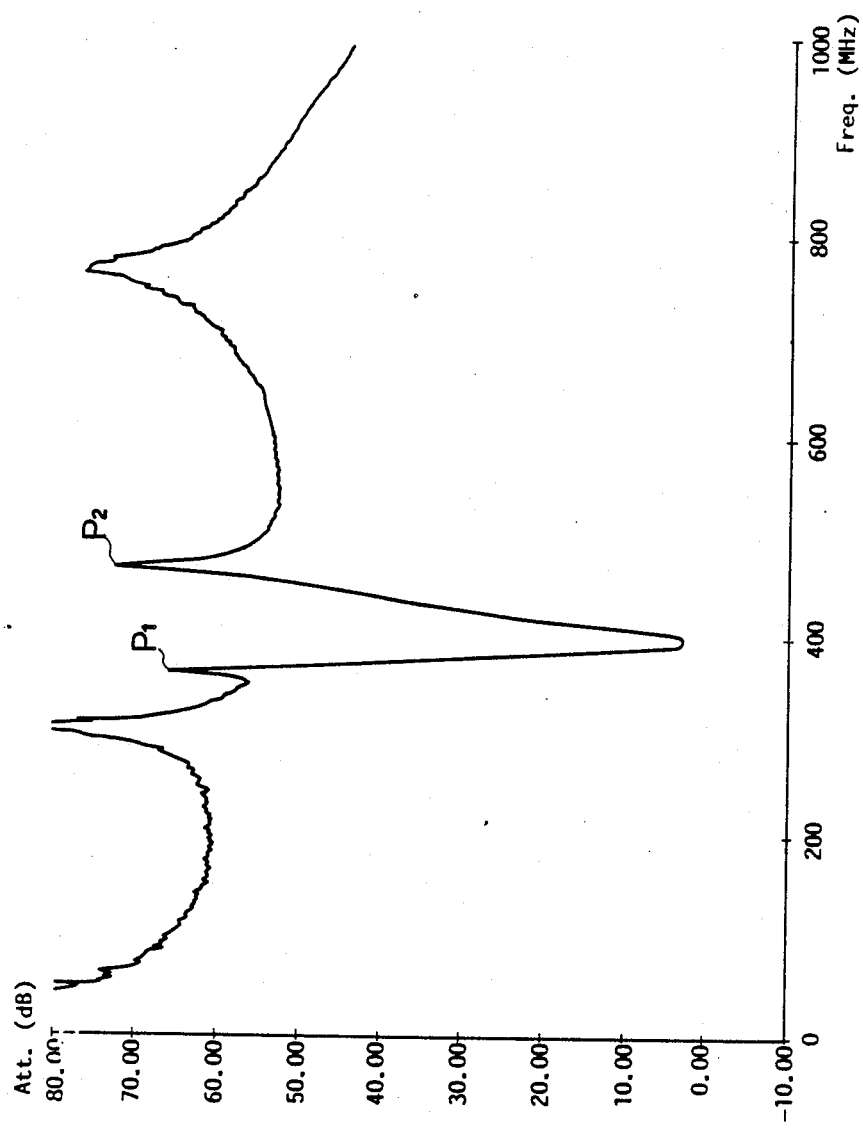
FIG. 25 is a view showing frequency characteristics of the filter shown in FIGS. 23A-23C.

FIGS. 23A through 23C illustrate a modification of the embodiment shown in FIGS. 20A through 20C. In this example the lead terminals 13 and 14 are connected to a different position. This modified bandpass filter has an equivalent circuit as shown in FIG. 24 and frequency characteristics as shown in FIG. 25. It will be seen from FIG. 25 that this bandpass filter also has sharp rising characteristics with poles P1 and P2 formed adjacent opposite sides of the center frequency (404 MHz).

In each of the described embodiments, a plurality of resonators are formed on a single dielectric substrate. However, it is not absolutely necessary to form the resonators on a single dielectric substrate. The resonators may be formed on a plurality of substrates.

Furthermore, a slit may be defined between the resonators in each of the described embodiment, which will provide a further advantage of preventing a spurious output.

Although the present invention has been fully described by way of examples with reference to the accompanying drawings, it is to be noted that various changes and modifications will be apparent to those skilled in the art. Therefore unless otherwise such changes and modifications depart from the scope of the present invention, they should be construed as being included therein.

What is claimed is:
1. A bandpass filter comprising:
a plurality of resonators; and
a magnetic induction coupling being established between adjacent pairs of said resonators, wherein each of said resonators includes
an LC series circuit, and
first capacitance element connected in parallel to said LC series circuit, said LC series current including a second capacitance element and two inductance elements, said second capacitance elements connected in series between said two inductance elements, and said magnetic induction coupling being provided by a coupling between at least one of said inductance elements of each adjacent pair of said resonators.

2. A bandpass filter as claimed in claim 1, wherein each said resonator comprises dielectric substrate means, two sets of capacitor electrode layers respectively formed on a front face and a back face of said dielectric substrate means and each set of capacitor electrode layers are opposed to each other across said electric substrate means, a first coil layer interconnecting the two of said capacitor electrode layers formed on the front face of said dielectric substrate means, and a second coil layer interconnecting the two of said capacitor electrode layers formed on the back face of said dielectric substrate means.

3. A bandpass filter as claimed in claim 2 wherein each said resonator is formed on separate dielectric substrates.

4. A bandpass filter as claimed in claim 2 wherein all of said resonators are formed on a single dielectric substrate.

5. A bandpass filter as claimed in claim 1 wherein each of said resonators comprises a substrate means, said two, inductance elements being two coil layers arranged parallel to each other on a front face of said substrate means, and said first and second capacitance elements being two capacitors interconnecting opposite end of said coil layers.

6. A bandpass filter as claimed in claim 5 wherein said substrate means is formed of ferrite.

7. A bandpass filter as claimed in claim 5 wherein therefor said plurality of said resonators are all formed on a single dielectric substrate.

8. A bandpass filter as claimed in claim 1 wherein at least one adjacent pair of said resonators are directly coupled by means of a coil in addition to said magnetic induction coupling.

9. A bandpass filter as claimed in claim 8 wherein said resonators and said coil are formed on said dielectric substrate means by screen printing.

10. A bandpass filter as claimed in claim 8 wherein each said resonator comprises dielectric substrate means, two sets of capacitor electrode layers respectively formed on a front face and a back face of said dielectric substrate means and each set of capacitor electrode layers are opposed to each other across said dielectric substrate means, a first coil layer interconnecting the two of said capacitor electrode layers formed on the front face of said dielectric substrate means, and a second coil layer interconnecting the two of said capacitor electrode layers formed on the back face of said dielectric substrate means.

11. A bandpass filter comprising:
a plurality of resonators; and
a magnetic induction coupling being established between adjacent pairs of said resonators, wherein each of said resonators includes
a substrate,
two coil layers formed on one of principal surfaces of the substrate, and
two capacitors each interconnecting opposed ends of said two coil layers,
said magnetic induction coupling being provided by a coupling between at least one of said coil layers of adjacent pairs of said resonators.

12. A bandpass filter as claimed in claim 11 wherein said plurality of said resonators are all formed on a single dielectric substrate.

13. A bandpass filter as claimed in claim 11 wherein said substrate means is formed of ferrite.

14. A bandpass filter comprising:
a plurality of resonators formed on a dielectric substrate means; and
a magnetic induction coupling being established between adjacent pairs of said resonators, wherein each of said resonators includes
two pairs of capacitor electrode layers formed on a front face and a back face of said dielectric substrate means and opposed to each other across said dielectric substrate means,
a first coil layer interconnecting two of said capacity electrode layers formed on the front face of said dielectric substrate means, and
a second coil layer interconnecting two of said capacitor electrode layers formed on the back face of said dielectric substrate means,
said magnetic induction coupling being provided by a coupling between said coil layers of an adjacent pair of said resonators.

15. A bandpass filter as claimed in claim 14 wherein each said resonator is formed on separate dielectric substrates.

* * * * *